United States Patent [19]

Dominguez et al.

[11] Patent Number: 5,508,205

[45] Date of Patent: Apr. 16, 1996

[54] METHOD OF MAKING AND UTILIZING PARTIALLY CURED PHOTOVOLTAIC ASSEMBLIES

[75] Inventors: Ramon Dominguez, Rockville; George J. Kelly, Mt. Airy, both of Md.

[73] Assignee: Amoco/Enron Solar, Frederick, Md.

[21] Appl. No.: 219,206

[22] Filed: Mar. 29, 1994

[51] Int. Cl.$^6$ .................... H01L 31/18; H01L 31/048
[52] U.S. Cl. .................. 437/2; 437/211; 437/212; 437/219; 156/99; 156/106; 156/196; 156/214; 156/285; 156/286; 156/297; 156/298; 156/307.1; 136/251
[58] Field of Search ............................. 136/251, 244; 437/2–5, 211, 212, 213, 219; 156/99, 102, 106, 196, 214, 285–286, 297, 298, 307.1, 307.5

[56] References Cited

U.S. PATENT DOCUMENTS

| | | | |
|---|---|---|---|
| 4,149,665 | 4/1979 | Costogue et al. | 288/5.1 |
| 4,287,382 | 9/1981 | French | 136/244 |
| 4,321,418 | 3/1982 | Dran et al. | 136/251 |
| 4,374,955 | 2/1983 | Gupta et al. | 525/281 |
| 4,383,129 | 5/1983 | Gupta et al. | 136/251 |
| 4,542,257 | 9/1985 | Fraser et al. | 136/251 |
| 4,686,321 | 8/1987 | Kishi | 136/244 |
| 4,717,790 | 1/1988 | Gochermann | 136/251 |
| 4,860,509 | 8/1989 | Laaly et al. | 52/173.3 |
| 5,176,758 | 1/1993 | Nath et al. | 136/251 |

FOREIGN PATENT DOCUMENTS

| | | | |
|---|---|---|---|
| 58-137265 | 8/1983 | Japan | 136/251 |

*Primary Examiner*—Aaron Weisstuch
*Attorney, Agent, or Firm*—Thomas W. Tolpin

[57] ABSTRACT

High-quality photovoltaic devices can be produced while lowering manufacturing costs by the inventive process. In the process, solar cells are manufactured, connected, and placed on one or more curable plastic sheets at a solar cell manufacturing plant. The plastic sheets are then heated at a sufficient temperature to bond the plastic sheets to the solar cells without a substantial amount of curing and polymerization of the plastic sheet. The plastic sheet is then cooled. The plastic sheet can be coated with a protective water-resistant coating. The partially cured photovoltaic subassembly is subsequently shipped to a manufacturing facility, such as a glass plant or automobile plant, where it is contacted with a glass support member providing a superstrate or a substrate. The plastic sheet of the photovoltaic subassembly is then fully cured, polymerized, and bonded to the glass superstrate or substrate.

15 Claims, No Drawings

METHOD OF MAKING AND UTILIZING PARTIALLY CURED PHOTOVOLTAIC ASSEMBLIES

BACKGROUND OF THE INVENTION

This invention pertains to solar cells and, more particularly, to a method for manufacturing photovoltaic devices.

Solar cells are useful to convert solar energy to electricity. Solar cells, the central components of a photovoltaic module, are very fragile. Although the support provided by a substrate such as glass or some other inflexible material may prevent bending and breakage, an encapsulation method is useful not only to provide protection by surrounding the cells but also to serve as a reliable method of attachment to the substrate. The encapsulating material, in addition to offering cost-effective performance should provide the following characteristics: ease of handling in module production; fast processing at temperatures not exceeding the tolerance of other module components, and free of bubbles and voids; potential for automation; high light-transmission; prolonged outdoor exposure capability and thermal stability; protection of the cells against mechanical damage from any outdoor environment; electrical isolation; minimal creep during thermal cycling; and low modulus to absorb stresses due to the differential thermal expansion of module components.

Solar cells and their electrical interconnections are typically covered with plastic and glass to ecologically protect the solar cells and interconnects from environmentally degrading as a result of humidity, pollution, wind, snow, and ice. As mentioned above, the glass and plastic should be free of air bubbles, pin holes, and voids which detract from the appearance of the photovoltaic device and may cause delamination and cell cracking. Solar cells can be used in glass modules, for solar vehicle roofs, architectural glass, facades and other photovoltaic devices.

Glass and automobile manufacturers are generally well equipped to manufacture, install and handle glass panes but are not generally well equipped to produce and assemble solar cells. For reasons of economy and efficiency, it is preferred to manufacture, align, and electrically connect solar cells at the solar manufacturing facility where there is appropriate equipment and skilled personnel for this purpose. The interconnected solar cells can then be transported to glass plants or vehicle factories for assembly of the glass panes since glass panes are heavy and expensive to ship to solar manufacturing facilities. Solar cells and soldered electrical interconnects are, however, fragile and tend to break when shipped loosely or unprotected.

It is, therefore, desirable to provide an improved process to manufacture photovoltaic devices which overcome most, if not all, of the preceding problems.

SUMMARY OF THE INVENTION

An improved process is provided to produce quality photovoltaic devices, such as solar modules, solar pixels, solar roofs, photovoltaic vehicle roofs, (sun roofs and moon roofs), windows, architectural glass, and photovoltaic facades. Advantageously, the improved process is economical, efficient, and effective.

To this end, the improved process includes fabricating, manufacturing, and assembling a photovoltaic subassembly without a substrate, superstrate, fabric, and fibers, for transport to a manufacturing facility. In order to construct the photovoltaic subassembly, an array, matrix, set, or series of solar cells are electrically interconnected and placed on at least one curable plastic sheet. The plastic sheet is preferably light transmissive, i.e., transparent or translucent, when fully cured. The plastic sheet can be: ethylene vinyl acetate (EVA), polyvinyl butyral (PVB), polymethyl methacrylate, ethylene methacrylic acid (EMA), or silicone rubber.

In the preferred process, the position and alignment of the solar cells are securely fixed to the plastic sheet by heating the plastic sheet so that a partially cured subassembly is formed. Such heating occurs at a sufficient temperature to bond the plastic sheet to the solar cells without substantially curing the plastic sheet. Preferably, this is accomplished at a pressure less than atmospheric pressure to withdraw (suck out) the air. The plastic sheet is then cooled to about 60° C. or room temperature. The plastic sheet can then be coated with a moisture-resistant, fluid-resistant coating of transparent plastic, e.g. polyethylene or polyvinyl fluoride film, such as sold under the brand name TEDLAR by DuPont De Nemours.

While polyvinyl butyral (PVB) plastic sheets can be thermally bonded to the solar cells, they can also be chemically bonded to the solar cells by dispensing a chemical solvent, such as isopropyl alcohol, on the plastic sheet in proximity to or adjacent the solar cells. The solvent is then vaporized.

In the process of this invention, the photovoltaic devices are constructed and assembled at a manufacturing facility, such as a glass plant or vehicle factory (e.g., automobile plant). At the manufacturing facility, the photovoltaic subassembly is placed on at least one glass or metal support member which provides a superstrate or a substrate. The plastic sheet of the photovoltaic subassembly is then fully cured at the manufacturing facility and concurrently bonded to the support member (superstrate or substrate) to securely fix and attach the photovoltaic subassembly to the support member. Preferably, the curing occurs at a sufficient melting temperature so that the plastic material from the sheet flows between the solar cells. Desirably, the curing pressure is kept below atmospheric pressure to minimize and substantially prevent the formation of air bubbles, pin holes, cracks, voids (spaces), and other defects in the photovoltaic device.

Crystalline silicon solar cells, such as monocrystalline silicon or preferably polycrystalline silicon, are particularly useful in photovoltaic devices manufactured by this process. Thin film amorphous silicon solar cells can also be advantageously used to manufacture photovoltaic; devices in accordance with this inventive process. Amorphous silicon solar cells can have an intrinsic i-layer of hydrogenated amorphous silicon, hydrogenated amorphous silicon carbon, or hydrogenated amorphous silicon germanium. The solar cells can have at least one junction which is operatively connected to the intrinsic layer. The junction can be a semiconductor junction, a multijunction, a tandem junction, a single junction, a double junction, a triple junction, a p-i-n junction, a n-i-p junction, a heterojunction, a recombination junction, a rectifying junction, or a barrier junction comprising a Schottky barrier.

The present invention provides a method for manufacturing assemblies of encapsulant layers of material with a solar cell array enclosed and maintained in a fixed configuration. These assemblies can be, delivered to a customer or to the final assembly operation where the lamination between glass or to a large-size architectural glass can be performed.

The partially cured assembly can be safely transported to a glass plant or automobile plant where the partially cured assembly (photovoltaic subassembly) can be laminated to the final glass structure. If the subassembly were completely cured before attachment (bonding) to the glass superstrate, the lamination process could not be successfully performed at the glass plant or automobile plant. Advantageously, the inventive process allows a solar cell manufacturing facility to use various shape and size solar cells and reduces the glass shipping costs to and from foreign and domestic glass plants and vehicle factories.

Important components of the photovoltaic subassembly include the array of solar cells or assembly of solar cells and various layers of encapsulating materials, such as ethylvinyl acetate (EVA), polyvinyl butyral (PVB), silicone rubber, etc. The encapsulating materials provide weather protection to the subassembly when it is completed and maintain the location and shape of the solar array.

Desirably, the size, configuration, and overall proportions of the partially cured photovoltaic subassembly are flexible and can be varied and adjusted per customer requirements. This is an important feature in the case of architectural glass, where the customer or architect specifies a particular module size to meet specific design configurations for new buildings.

Several methods of preparing partially cured assemblies can be used. In the preferred process, partial lamination of solar cells is accomplished using EVA films. This method includes a preliminary lamination cycle under vacuum at a temperature below the polymerization level. The partially curing (bonding) temperature preferably ranges from 90° C. to 120° C. This can be achieved by lowering the temperature or shortening the cycle time during the process in standard laminator equipment. Complete full curing is preferably accomplished at a curing temperature of at least 135° C. to 140° C. to laminate the plastic to the glass without creating air bubbles and outgassing.

Partial lamination can also be accomplished with other plastic sheet materials, such as PVB, silicone rubber, etc. PVB can comprise dibutyl sebacate plasticizer and polyvinyl butyral resin. These materials may require a different time and temperature to achieve similar results as EVA.

Test assemblies have been successfully made to demonstrate the ability of these products for the manufacture of sun roof assemblies between two pieces of glass. Test assemblies have also been successfully laminated to flat glass for use in the architectural market.

A more detailed explanation of the invention is provided in the following detailed description and appended claims.

DETAILED DESCRIPTION OF THE PREFERRED EMBODIMENTS

An improved manufacturing process is provided to efficiently produce high-quality photovoltaic devices in a cost-effective safe manner. In the process, a photovoltaic subassembly is fabricate and assembled in a photovoltaic plant or solar cell manufacturing facility. Solar cells are preferably manufactured with at least one active region of polycrystalline silicon. In some circumstances, it may be desirable to manufacture solar cells with at least one active region of monocrystalline silicon or thin-film solar cells with at least one active region of hydrogenated amorphous silicon, hydrogenated amorphous silicon carbon, or hydrogenated amorphous silicon germanium.

At the photovoltaic plant, a set, array, matrix, or series of solar cells are aligned, arranged, and electrically connected. Solar cells can then be contacted with or placed upon at least one curable plastic sheet, preferably made of ethylene vinyl acetate (EVA) for best results. A primer can be blended with or added to the EVA, or sprayed or brushed on the solar cells, superstrate or substrate, to enhance bonding. The primer can comprise an organo-silicon compound and amine catalyst dissolved in methyl alcohol, e.g. a 1% solution (90% by wt. Dow Corning Z-6030, 9% by wt. benzyl dimethyl amine, and 1% by wt. Lupersol 101 Peroxide) in anhydrous or dry methyl alcohol. The solar cells are then securely affixed and bonded to the plastic sheet by laminating the plastic sheet to the solar cells in a laminator at a bonding (partially curing) temperature ranging from 90° C. to 120° C. at a vacuum pressure (partial pressure). The plastic sheet is then cooled to about room temperature to form the partially cured photovoltaic subassembly. The plastic sheet is preferably covered with a water-impervious, dirt-resistant protective coating of transparent plastic, such as polyvinyl fluoride (e.g., Tedlar brand plastic) or polyethylene.

The partially cured photovoltaic subassembly can then be safely shipped by airplane, ship, train, truck, bus, van, car or other vehicle to a manufacturing facility, such as an automobile plant or a glass manufacturing plant. The manufacturing facility connects and assembles the partially cured photovoltaic subassembly to one or more support members, which provide superstrates and/or substrates, to produce a photovoltaic device, such as a solar vehicle roof, moon roof, architectural glass, or photovoltaic facade.

At the manufacturing facility, the partially cured photovoltaic subassembly is placed on at least one support member (superstrate or substrate). The support member preferably comprises a transparent glass pane. In some circumstances, it may be desirable to use a metal support member made of stainless steel, iron, aluminum, niobium, tantalum, chromium, bismuth, or antimony. The support member can also be laid upon the photovoltaic subassembly.

The partially cured photovoltaic subassembly on the support member is then heated in an autoclave or laminator at the manufacturing facility. Heating preferably occurs at a melting temperature of at least 135° C. to substantially and fully cure and polymerize the plastic sheet and simultaneously securely thermally bond the plastic sheet to the support member. During the curing cycle, heat is applied to the EVA to melt it around the solar cells and to cure it to a rubbery solid. Curing is essential to module functioning. Improperly cured EVA film remains thermoplastic and may flow or creep from the heat of the sun. EVA when fully cured to a thermoset plastic protects the solar cells, prevents melting and offers excellent resistance to creep.

For some photovoltaic products, lamination at the solar cell manufacturing facility includes encapsulating and sandwiching the solar cells between a pair of plastic sheets of ethylene vinyl acetate (EVA) in the laminator. The partially cured photovoltaic subassembly can then be positioned between a pair of glass panes at the manufacturing facility where the plastic sheets can be laminated and securely bonded to the glass panes.

In order to manufacture photovoltaic vehicle roofs (sun roofs and moon roofs), the glass pane(s) providing the superstrate or substrate is first curved and vented at a glass deformation (bending) temperature to form the main body of the curved vehicle roof before the partially cured photovoltaic subassembly is placed on the glass pane or vice versa.

Test photovoltaic devices were manufactured in accordance with the inventive process described above. These photovoltaic devices were tested and produced surprisingly good results.

Among the many advantages of the inventive process are: (1) production of high quality photovoltaic devices; (2) less breakage; (3) minimal solar cell shifting; (4) bubble free encapsulation; (5) ease of lamination; (6) excellent adhesion; (7) low cost; (8) efficiency; and (9) effectiveness.

Although embodiments of this invention have been shown and described, it is to be understood that various modifications and substitutions, as well as rearrangements of parts, components, and process steps can be made by those skilled in the art without departing from the novel spirit and scope of this invention.

What is claimed is:

1. A process for producing photovoltaic devices, comprising the steps of:

fabricating a photovoltaic subassembly in the absence of a substrate, superstrate, fabric and fibers at a photovoltaic plant by electrically interconnecting an array of solar cells, placing said array of solar cells on at least one curable plastic sheet, said plastic sheet being light transmissive when fully cured, partially curing said plastic sheet, and simultaneously preventing said plastic sheet from polymerizing during said partially curing, securely fixing the position of the solar cells to said plastic sheet during said partially curing, said partially curing and said preventing of polymerization comprising heating said plastic sheet at a partial curing temperature to bond said plastic sheet to said solar cells, said partial curing temperature being below a polymerization temperature of said plastic sheet, preventing formation of air bubbles in said plastic sheet during said partially curing by partially curing said plastic sheet at a pressure less than atmospheric pressure, and cooling said partially cured plastic sheet before said plastic sheet has polymerized;

transporting said photovoltaic subassembly from said photovoltaic plant to a manufacturing facility;

assembling a photovoltaic device at the manufacturing facility by placing said photovoltaic subassembly on at least one support member selected from the group consisting of a substrate and a superstrate, polymerizing and completely curing said plastic sheet by heating said plastic sheet to at least a melting temperature of said plastic sheet at the manufacturing facility, preventing air bubbles from forming in said plastic sheet during polymerizing; and completely curing by polymerizing and completely curing said plastic sheet at a pressure less than atmospheric pressure, and simultaneously thermally bonding said plastic sheet to said support member to securely fix said photovoltaic subassembly to said support member.

2. A process in accordance with claim 1 wherein said light transmissive plastic sheet is selected from the group consisting of a translucent material and a transparent material.

3. A process in accordance with claim 1 wherein said plastic sheet is selected from the group consisting of ethylene vinyl acetate, ethylene vinyl acetate and a primer, polyvinyl butyral, polymethyl methacrylate, ethylene methacrylic acid, and silicone rubber.

4. A process in accordance with claim 1 wherein:

said plastic sheet comprises ethylene vinyl acetate (EVA);

said partial curing temperature ranges from about 90° C. to about 120° C.; and said melting temperature is about 135° C.

5. A process in accordance with claim 1 wherein said curing occurs at a sufficient melting temperature so that plastic material from said plastic sheet flows between said solar cells.

6. A process in accordance with claim 1 wherein said plastic sheet covers said solar cells add said plastic sheet is coated with a moisture resistant protective coating about said solar cells.

7. A process in accordance with claim 6 wherein said coating is selected from the group consisting of polyvinyl fluoride and polyethylene.

8. A process in accordance with claim 1 wherein said heating said plastic sheet during said partially curing includes partially laminating said plastic sheet to said solar cells.

9. A process in accordance with claim 1 wherein said solar cells comprises crystalline solar cells selected from the group consisting of polycrystalline silicon and monocrystalline silicon; and said transporting includes moving said photovoltaic subassembly in a transport selected from the group consisting of an airplane, ship, truck, vehicles, and train.

10. A process in accordance with claim 1 wherein:

said solar cells comprise amorphous silicon solar cells having an intrinsic layer selected from the group consisting of hydrogenated amorphous silicon, hydrogenated amorphous silicon carbon, and hydrogenated amorphous silicon germanium;

said solar cells having at least one junction operatively connected to said intrinsic layer, said junction being selected from the group consisting of semiconductor junction, a tandem junction, a single junction, a double junction, a triple junction, a multi-junction, a heterojunction, a recombination junction, a rectifying junction, and a barrier junction comprising a Schottky barrier;

said support member comprises a metal selected from the group consisting of aluminum, niobium, tantalum, chromium, bismuth, antimony, iron, and stainless steel; and said photovoltaic device is selected from the group consisting of a solar roof, sun roof, moon roof, windshield, rear window, architectural glass, facade, solar module, and solar panel.

11. A process in accordance with claim 1 wherein:

said manufacturing facility comprises a glass plant;

said support member comprises glass, and said photovoltaic device comprises architectural glass or a glass facade.

12. A process in accordance with claim 1 wherein:

said manufacturing facility comprises an automobile plant;

said support member comprises glass; and said glass is bent to form curved glass before said plastic sheet is polymerized, completely cured and bonded to said glass.

13. A process for producing photovoltaic devices, comprising the steps of:

fabricating a photovoltaic subassembly in a photovoltaic plant by electrically connecting a set of solar cells, said solar cells comprising at least one active region selected from the group consisting of polycrystalline silicon, monocrystalline silicon, hydrogenated amorphous silicon, hydrogenated amorphous silicon carbon, and hydrogenated amorphous silicon germanium, contacting said solar cells with at least one curable plastic sheet comprising ethylene vinyl acetate, securely fixing said solar cells to said plastic sheet by partially laminating said plastic sheet to said solar cells in a laminator at a temperature ranging from about 90° C. to about 120° C. at a vacuum pressure, preventing polymerization of said plastic sheet during said partially laminating, cooling said partially laminated plastic sheet to about room temperature before said plastic sheet has polymerized, and covering said plastic sheet with a water-impervious dirt-resistant protective coating of transparent plastic selected from the group consisting of polyvinyl fluoride and polyethylene;

shipping said photovoltaic subassembly from said photovoltaic plant to a manufacturing facility selected from the group consisting of an automobile plant and a glass plant, said shipping including transport in an airplane, ship, train, truck, bus, van or vehicle;

assembling a photovoltaic device selected from the group consisting of a solar roof, moon roof, architectural glass, and photovoltaic facade, at the manufacturing facility by placing said photovoltaic subassembly on at least one support member selected from the group consisting of metal and a transparent glass pane, said support member providing a substrate or superstrate, and heating said photovoltaic subassembly and support member in an autoclave or laminator at said manufacturing facility at a melting temperature of at least about 135° C. at a vacuum pressure to completely cure and polymerize said ethylene vinyl acetate plastic sheet around said solar cells and securely thermally bond said ethylene vinyl acetate plastic sheet to said support member to resist creep and prevent subsequent melting of said plastic sheet in said photovoltaic devices from heat of the sun during use of said photovoltaic devices.

14. A process in accordance with claim 13 wherein:

said partially laminating includes encapsulating and sandwiching said solar cells between a pair of curable plastic sheets of ethylene vinyl acetate in the laminator at the photovoltaic plant;

said photovoltaic subassembly is positioned between a pair of glass panes at said manufacturing facility; and said heating includes completely laminating said plastic sheets to said glass panes.

15. A process in accordance with claim 13 wherein:

said support member comprises a glass pane, said glass pane is curved and bent at a deformation temperature to form the main body of a curved vehicle roof before said photovoltaic subassembly is placed on the glass pane and before said ethylene vinyl acetate plastic sheet is completely cured.

\* \* \* \* \*